(12) United States Patent
Huang

(10) Patent No.: US 9,307,635 B2
(45) Date of Patent: Apr. 5, 2016

(54) ELECTRODE PATTERN AND TOUCHSCREEN USING THE SAME

(71) Applicants: Interface Optoelectronics (Shenzhen) Co., Ltd., Shenzhen, Guangdong (CN); GENERAL INTERFACE SOLUTION LIMITED, Miaoli County (TW)

(72) Inventor: Kung-Chieh Huang, Taoyuan County (TW)

(73) Assignees: INTERFACE OPTOELECTRONICS (SHENZHEN) CO., LTD., Shenzhen, Guangdong (CN); GENERAL INTERFACE SOLUTION LIMITED, Miaoli County (TW)

( * ) Notice: Subject to any disclaimer, the term of this patent is extended or adjusted under 35 U.S.C. 154(b) by 18 days.

(21) Appl. No.: 14/303,611

(22) Filed: Jun. 13, 2014

(65) Prior Publication Data

US 2014/0291008 A1    Oct. 2, 2014

(30) Foreign Application Priority Data

Jun. 17, 2013   (CN) .......................... 2013 1 0239017

(51) Int. Cl.
*H05K 1/02* (2006.01)

(52) U.S. Cl.
CPC ............ *H05K 1/0296* (2013.01); *H05K 1/0287* (2013.01); *H05K 2201/0108* (2013.01); *H05K 2201/09681* (2013.01)

(58) Field of Classification Search
USPC .................................................. 345/173, 174
See application file for complete search history.

(56) References Cited

U.S. PATENT DOCUMENTS

| | | | | |
|---|---|---|---|---|
| 2005/0259082 A1* | 11/2005 | Potsch | ........................... | 345/173 |
| 2007/0063983 A1* | 3/2007 | Huang et al. | ..................... | 345/173 |
| 2009/0273577 A1* | 11/2009 | Chen et al. | ..................... | 345/174 |
| 2010/0079384 A1* | 4/2010 | Grivna | ......................... | 345/173 |
| 2010/0302201 A1* | 12/2010 | Ritter et al. | ..................... | 345/174 |
| 2011/0102361 A1* | 5/2011 | Philipp | ......................... | 345/174 |
| 2012/0044165 A1* | 2/2012 | Kwak et al. | ..................... | 345/173 |
| 2012/0262382 A1* | 10/2012 | Guard et al. | .................. | 345/173 |

* cited by examiner

*Primary Examiner* — Michael F McAllister

(74) *Attorney, Agent, or Firm* — Locke Lord LLP; Tim Tingkang Xia, Esq.

(57) ABSTRACT

A touchscreen electrode pattern constituted by wavy conductive lines, each wavy conductive line includes multiple troughs of wave and multiple crests of waves, wherein an interval between adjacent troughs of waves in each wavy conductive line is larger than 1.5 times of a predetermined value, and an amplitude difference between adjacent trough of waves and crest of waves in each wavy conductive line is smaller than ⅓ times of the predetermined value.

9 Claims, 4 Drawing Sheets

ELECTRODE PATTERN AND TOUCHSCREEN USING THE SAME

BACKGROUND OF THE INVENTION

1. Field of the Invention

The present invention generally relates to a touchscreen, and more particularly, to a touchscreen with a mesh-like electrode pattern which is capable of eliminating the moiré phenomenon.

2. Description of the Prior Art

Touchscreen displays are able to detect a touch within the active or display area, such as detecting whether a finger is present pressing a fixed-image touchscreen button or detecting the presence and position of a finger on a larger touchscreen display. Some touchscreens can also detect the presence of elements other than a finger, such as a stylus used to generate a digital signature, select objects, or perform other functions on a touchscreen display.

The Use of a touchscreen as part of a display allows an electronic device to change a display image, and to present different buttons, images, or other regions that can be selected, manipulated, or actuated by touch. Touchscreens can therefore provide an effective user interface for cell phones, GPS devices, personal digital assistants (PDAs), computers, ATM machines, and other devices.

Touchscreens use various technologies to sense touch from a finger or stylus, such as resistive, capacitive, infrared, and surface acoustic sensors. A capacitive touch screen, for example, may include an insulator coated with a transparent conductor such as indium tin oxide (ITO) or transparent conductive polymers such as PEDOT (polyethylene dioxythiophene) in a particular pattern. When an object, such as a finger or a stylus, touches the surface of the screen, there may be a change in capacitance. This change in capacitance may be sent to a controller for processing to determine where the touch occurred on the touch screen.

While transparent conductors such as ITO may be used for electrodes, however, since the transparent conductive layer has high resistance of 100 ohms/square or more, the sensitivity is lowered when the display device is manufactured in a large scale, and as the size of screen is increased, the cost of the ITO film is rapidly increased. Accordingly, it is not easy to perform commercialization thereof.

In order to overcome this conventional issue, there is an effort to implement enlargement by using an opaque metal pattern having high conductivity. When the electrode pattern is made of the metal, electric conductivity is excellent, and demand and supply is smooth. In the case in which the electrode pattern is made of the metal such as copper, silver or other conductive materials, the electrode pattern should be formed in a mesh structure in a micrometer (μm) unit in order to prevent users from recognizing the electrode pattern and make the electrodes substantially invisible to the naked eye.

However, when the electrode pattern of the touch panel is formed in the mesh structure having regular and constant intervals, there is a problem in that period characteristics of the metal mesh electrode pattern of the touch panel may cause interference with a periodic pixel pattern of the IC circuit or a regular pattern structure of another optical film, such as a black matrix pattern of a color filter included in an image display device overlapped with each other, thereby causing a so-called "moiré" phenomenon. Herein, the moiré means an interference pattern formed when two or more regular and repeating patterns overlap.

The occurrence of moiré makes it difficult to see a displayed image of the display, and thereby deteriorates the visual operability or usability of the touch screen device. Categorized broadly, moiré may be low-frequency moiré in which large patterns consecutively appear, or high-frequency moiré in which small patterns consecutively appear. In particular, low-frequency moiré will make the display difficult to be viewed.

SUMMARY OF THE INVENTION

The present invention has been made in an effort to address the above-mentioned situation and circumstances that can occur in the conventional technologies. A touchscreen includes sensing electrode elements is provided and distributed across an active area of a substrate, and the touchscreen overlays a display. The sensing electrode elements form a mesh pattern configured to avoid creating moiré patterns by utilizing irregular wavy, zig-zag or randomized line configurations.

The objective of the present invention is to provide a mesh electrode pattern constituted by wavy conductive lines. Each wavy conductive line includes multiple troughs of wave and multiple crests of waves. An interval between adjacent troughs of waves in each wavy conductive line is larger than 1.5 times of a predetermined value. An amplitude difference between adjacent trough of waves and crest of waves in each wavy conductive line is smaller than ⅓ times of the predetermined value.

According to the present invention, by superposing the regular pattern of other panel components with the touchscreen having above-mentioned specific irregular mesh electrode patterns, it is possible to inhibit the moiré phenomenon.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
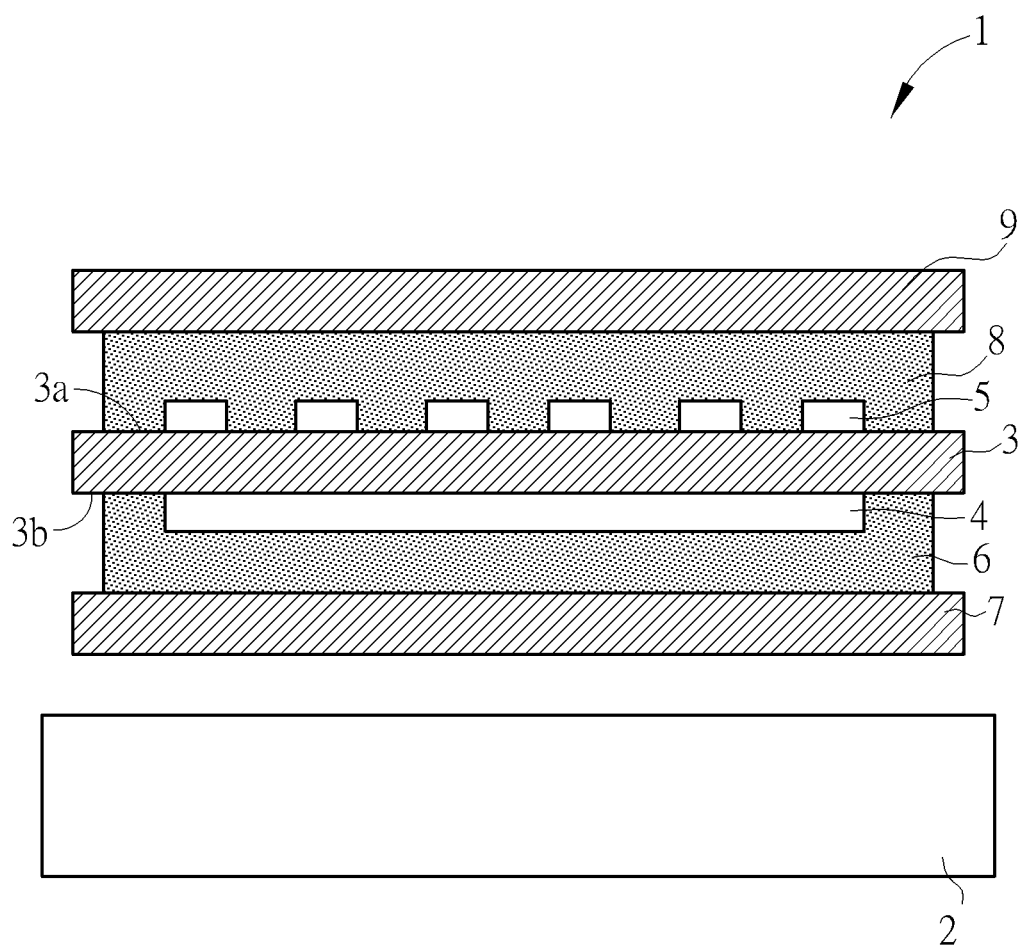
FIG. 1 is an exemplary cross-sectional view of a touch position-sensing panel which overlies a display in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

FIG. 1 illustrates an exemplary touch position-sensing panel 1 which overlies a display 2. In the illustrated example, the panel 1 includes an insulating substrate 3 having two opposing faces 3a and 3b. Although touch sensors may implement other types of touch sensing, for discussion purposes, the drawing shows an example of a structure that may be used to implement a mutual capacitance type touch sensitive panel.

The panel 1 includes a number of lower electrodes 4 and a number of upper electrodes 5 provided on opposite faces 3a and 3b of the substrate 3. The electrodes 4, which may be on face 3b, may be arranged in one direction and the electrodes 5, which may be on face 3a, may be arranged in a direction different from the direction of electrodes 4. Other conductive tracks may also be provided on the opposing faces 3a and 3b of the substrate 3. Such other conductive tracks may provide drive and sense connections to the electrodes 4 and 5. The substrate 3 may be provided adjacent to the display 2 such that electrodes 4 are arranged between the display 2 and the substrate 3. An adhesive layer 6 comprised of an optically clear adhesive may be disposed between the electrodes 4 and a transparent covering sheet 7. An adhesive layer 8 comprised of an optically clear adhesive may be disposed between the electrodes 5 and a transparent covering sheet 9. A gap may be formed between the display 2 and the transparent covering sheet 7. As an example and not by way of limitation, the display 2 underneath the touch sensor may be a liquid crystal display (LCD), a light-emitting diode (LED) display, a LED-backlight LCD, or other suitable display.

The transparent covering sheet 7 and the adhesive layer 6 may encapsulate all electrodes 4 and any other conductive tracks formed on face 3b of the substrate 3. The transparent covering sheet 9 and the adhesive layer 8 may encapsulate all electrodes 5 and any other conductive tracks formed on face 3a of the substrate 3. The encapsulation of the electrodes 4 and 5 and any other conductive tracks, may provide protection from physical and environmental damage. In some examples, portions of the conductive tracks may be exposed to provide connection points for connection to external drive circuitry.

In the mutual capacitance example, electrodes 4 may be drive electrodes provided on face 3b of the substrate 3, and electrodes 5 may be sense electrodes provided on the opposing face 3a of the substrate 3. Capacitive sensing channels may be formed by capacitive coupling nodes in the localized regions around where electrodes 4 and 5 cross over each other and are separated by the substrate 3.

The electrode pattern 4 and 5 serve to generate a signal at the time of a touch by a user to allow a controller to recognize a touch coordinate. Here, the electrode patterns 4 and 5 may be made of copper (Cu), aluminum (Al), gold (Au), silver (Ag), titanium (Ti), palladium (Pd), chromium (Cr), and other metals used in conductive wiring. In addition, the electrode pattern may be formed by a plating process or a depositing process using a sputter.

In some examples, the sense electrodes may be patterned in fine or micro wires to allow most of the light emitted from the display and incident on the sense electrode layer to pass through the electrode layer between the fine metal wires. The fine lines may be no more than 20 microns wide. An exemplary range may be 1-5 microns. Narrower lines have reduced visibility to the naked eye. By forming electrodes 4 or 5 from micro conductive lines, the position-sensing panel may be formed such that no more than about 10% of the active area is covered by the metal lines of the electrodes. Less coverage of the active area allows for greater transparency of the position-sensing panel and reduces visibility of the electrodes to the human eye. It may also reduce perceptible darkening or other loss of display quality. An exemplary coverage may be less than 5%.

In some examples, the electrodes 4 may be formed of a clear conductive material and the electrodes 5 may be formed of narrow conductive lines. In other examples, the electrodes 4 may be formed of narrow conductive lines and the electrodes 5 may be formed of a clear conductive material.

In an example where other conductive tracks in addition to the electrodes 4 and 5 are provided on the substrate 3, the other conductive tracks may also be formed of a clear conductive material or narrow conductive lines, in a manner similar to the electrode layers 4 and 5. In an example where the other conductive tracks, or parts of the other conductive tracks, lie outside a visible region of the display 2, the light-transmissibility of the other conductive tracks is of no concern.

Since the electrode pattern 4 and 5 are formed on the transparent substrate 3, the transparent substrate 3 needs to have support force capable of supporting the electrode pattern 4 and 5 and transparency capable of allowing a user to recognize an image provided from the image display device. In consideration of the support force and the transparency described above, the transparent substrate 3 may be made of polyethylene terephthalate (PET), polycarbonate (PC), poly methyl methacrylate (PMMA), polyethylene naphthalate (PEN), polyethersulfone (PES), a cyclic olefin polymer (COC), a triacetylcellulose (TAC) film, a polyvinyl alcohol (PVA) film, a polyimide (PI) film, polystyrene (PS), biaxially oriented polystyrene (BOPS; containing K resin), glass, tempered glass, or the like, but is not necessarily limited thereto.

Configuration of touchscreen elements relative to the line or pixel configuration of the display 2 is important in some applications to reduce moiré patterns, as line configurations that cover regular or repeating patterns of pixels can create interference or moiré patterns in the touchscreen display assembly. It is therefore desirable in the embodiment to configure electrodes being irregular or being oriented at angles that do not cause such interference with the underlying display assembly.

Figure 2:
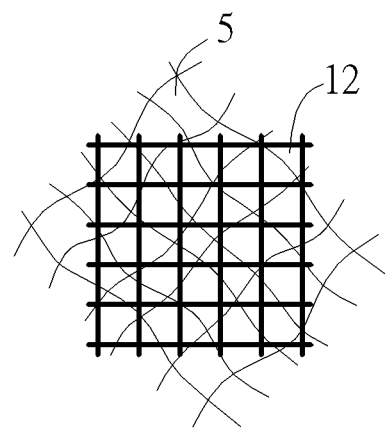
FIG. 2 is a plan view showing a state in which a pixel pattern formed in a display is overlapped with the pattern of mesh electrode of FIG. 1.

For this reason, FIG. 2 shows a state in which a pixel pattern 12 (thick lines) formed in the display 2 is overlapped with the pattern of mesh electrode 5 (thin lines) of FIG. 1. As shown in FIG. 2, an array of pixels 12 included in the display 2 that each displays at least a portion of an image may be visible through conductive lines of the mesh electrode pattern 5. In a case where the mesh electrode pattern 5 is disposed on a display 2 having such a pixel pattern 12, the conductive lines in the mesh electrode pattern 5 may orient to certain oblique angles with respect to the horizontal and vertical arrangement directions of the pixels in the display. The angle between the imaginary line of mesh pattern 5 and pixel pattern 12 may range from 30° to 60°, preferably 30° to 40°.

As shown in FIG. 2, the mesh electrode pattern 5 has an irregular, non-periodic shape, while a pixel pattern 12 (or a black matrix pattern of a color filter in backlight module) included in the display 2 (ex. a liquid crystal display (LCD), or the like) has the translation symmetry with periodic lattice structures. As a result, even though the mesh electrode pattern 5 and the pixel pattern 12 are disposed to be overlapped with each other, generation of an interference phenomenon may be minimized, such that the moiré phenomenon may be prevented. In addition, due to the irregularity of the mesh electrode pattern 5, the generation of an interference phenomenon may also be minimized even though the mesh electrode pattern 5 and the pixel pattern 12 rotates to different directions with respect to each other.

Furthermore, the opening ratio per unit area of the mesh electrode pattern 5 may be maintained to be constant, such that the touch panel may secure uniform electric conductivity and visibility.

Figure 3:
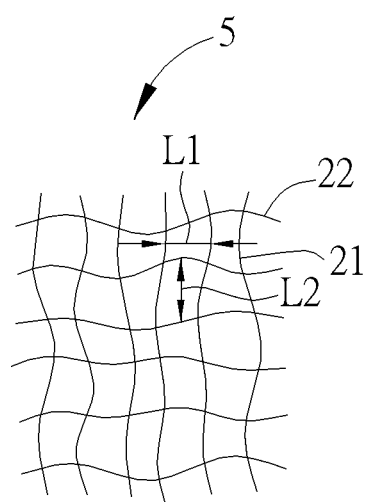
FIG. 3 is a plan view individually showing a mesh electrode pattern in accordance with one preferred embodiment of the present invention.

Please refer now to FIG. 3, which illustrates a plan view individually showing a mesh electrode pattern according to the preferred embodiment of the present invention. As shown in FIG. 3, in this embodiment, the mesh electrode pattern 5 is composed of a group of first electrodes 21 crossing a group of second electrodes 22 in wavy line fashion, such that the conductive grid or mesh pattern is made up of an array of substantially irregular shaped mesh cells. Each first electrode 21 and second electrode 22 is non-linear, wavy conductive lines (ex. in a sinusoidal fashion) arranged respectively at a first pitch L1 and a second pitch L2. The finger's influence on multiple drive and receive conductive lines (i.e. touchscreen electrodes) enables the touchscreen display to detect the vertical and horizontal position of a finger on the touchscreen display with very good accuracy, well beyond simply determining in which of the vertical and horizontal regions the finger is located. To achieve this result, the line pitch here is configured anticipating a fingerprint that is approximately 8 mm in diameter. The first pitch L1 and the second pitch L2 may be selected within a range of 150 μm to 6000 μm (6.0 mm). The line width of the first electrodes 21 and second electrodes 22 may be selected within a range of 1 μm to 10 μm.

When using fine line metal mesh electrodes that are 5 μm in width, the pitch between the conductive lines would be several decuples to several hundred times of the width of the lines, resulting in a very low line density and a relatively large width from line to line. Both the low density and relatively large spacing between lines reduce the likelihood of producing visible moiré patterns when overlaying a display having a regularly repeating pixel configuration. In other examples, the line pitch is at least 20, 50, 100, or 150 times greater than the line width.

In addition, the group of first electrodes 21 and the group of second electrodes 22 in the mesh electrode pattern 5 form a large number of lattice intersection points. Each electrode is formed in a wavy line shape containing at least one curve/wave between the intersections.

Figure 4:
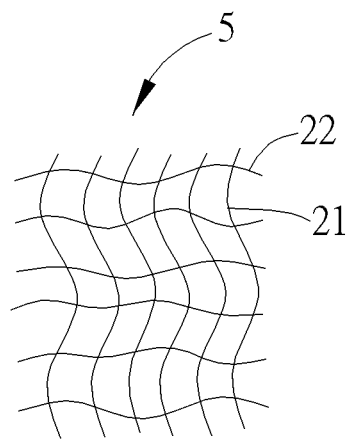
FIG. 4 is a plan view individually showing a mesh electrode pattern in accordance with another embodiment of the present invention.

The irregular or sinusoidal shape of the conductive lines as shown in FIG. 4 may reduce diffraction effects which may be encountered if straight conductive lines are used. Such diffraction effects may result in the appearance of "starburst" patterns when a touch position-sensing panel is subject to bright ambient light. Such diffraction effects may result in color shifting, changing the apparent colors of liquid crystal display (LCD) elements of a display visible through a touch position-sensing panel, and may obscure the image being displayed.

Moreover, the irregular or sinusoidal shape of the conductive lines may also reduce the visibility of reflections from the conductive lines when a touch position sensing panel is illuminated by light from a point illumination source, such as the sun on a clear day. The sinusoidal shape of the conductive lines may tend to distribute or disperse the apparent position on the touch position sensing panel of such reflections, and so may minimize the perceived visibility of repetitive reflection patterns. Such repetitive reflection patterns are readily perceived by the human eye.

Please refer to FIG. 4, which illustrates a plan view individually showing a mesh electrode pattern according to another embodiment of the present invention. In this embodiment, the mesh electrode pattern 5 is composed of a plurality of first electrodes 21 and second electrodes 22. Each of the electrodes 21 and 22 is a non-linear conductive line. However, each first electrode 21 has the same line wavy shape, while adjacent second electrodes 22 have different wavy shapes.

Figure 5:
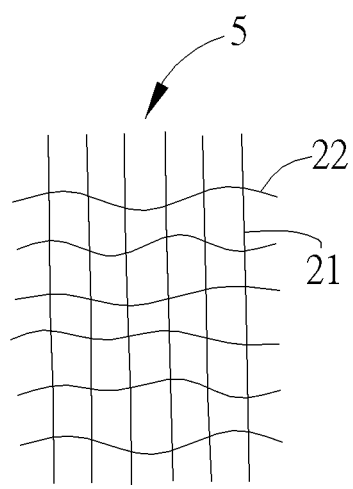
FIG. 5 is a plan view individually showing a mesh electrode pattern in accordance with still another embodiment of the present invention.

Please refer to FIG. 5, which illustrates a plan view individually showing a mesh electrode pattern according to still another embodiment of the present invention. In this embodiment, the mesh electrode pattern 5 is composed of a plurality of first electrodes 21 and second electrodes 22. However, each first electrode 21 is in straight line shape, while each second electrode 22 is in non-linear wavy shape. Furthermore, adjacent second electrodes 22 have different wavy shapes.

Figure 6:
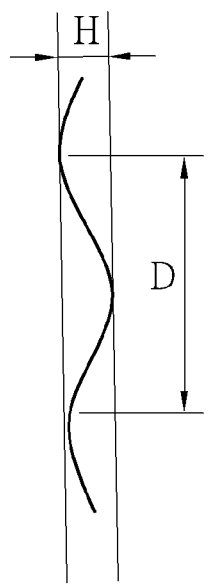
FIG. 6 illustrates a single wavy conductive line in the mesh electrode pattern in accordance with one preferred embodiment of the present invention.

Please refer now to FIG. 6, which illustrate a single conductive line in the mesh electrode pattern according to one preferred embodiment of the present invention. In this embodiment, each conductive line, including first electrode 21 and second electrode 22, in the mesh electrode pattern 5 is a wavy structure. The numbers of waves in adjacent conductive lines are different. The interval D between two adjacent troughs of waves in each conductive line is preferably configured to be larger than 1.5 times of a predetermined value. Furthermore, the amplitude difference H between adjacent crest and through of waves in each conductive line is preferably configured to be smaller than ⅓ times of said predetermined value. The predetermined value is preferably the pixel pitch of the underlying display 2. The pixel pitch is the distance between the centers of two adjacent pixels in the display 2. The wavy conductive line in the mesh electrode pattern 5 should fulfill the requirement that at least two intervals D among multiple intervals in all wavy conductive lines are different, or at least two amplitude differences H among multiple amplitude differences in all wavy conductive lines are different.

Of course, in an alternative embodiment, the requirement may be at least two intervals D in multiple intervals D of one or more wavy conductive lines are different, or at least two amplitude differences H in multiple amplitude differences H of one or more wavy conductive lines are different.

In still another embodiment, the requirement may be the intervals D between two adjacent troughs of wave in a number of the wavy conductive lines being configured larger than 1.5 times of a predetermined value, and the amplitude differences H between adjacent crest and through of wave in a number of the wavy conductive lines being configured smaller than ⅓ times of said predetermined value.

Figure 7:
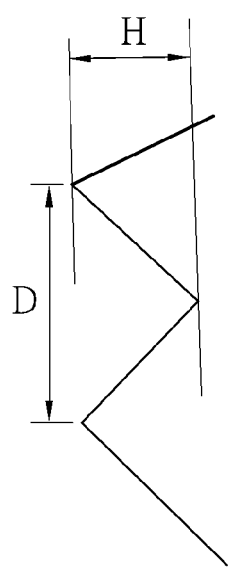
FIG. 7 illustrates a single zig-zag conductive line in the mesh electrode pattern in accordance with another embodiment of the present invention.

Please refer now to FIG. 7, which illustrate a single conductive line in the mesh electrode pattern according to another embodiment of the present invention. In this embodiment, unlike the one shown in FIG. 6, the non-linear conductive line is in zig-zag shape rather than wavy shape. The intervals D between two adjacent vertices in the same side is configured larger than 1.5 times of a predetermined value, and the amplitude differences H between adjacent vertices in opposite sides is configured smaller than ⅓ times of said predetermined value.

In the embodiment, wavy lines are used to avoid long linear stretches of fine metal line, reducing the probability of causing interference patterns. Similarly, the fine metal lines in zig-zag form may also break up the long linear stretches of parallel lines. The conductive lines in above fashions would follow a more randomized pattern. Furthermore, the randomized electrode line may be shifted laterally from line to line to break up vertical regularity in the electrode pattern; the amount of shifting from line to line can in itself be randomized to further suppress the ability of groups of lines to cause a moiré effect. Fractal-based or other irregular shapes are used in further embodiments to achieve a similar effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrode pattern, comprising:
a group of first electrodes; and
a group of second electrodes across said group of first electrodes, said group of first electrodes and said group of second electrodes constituting a mesh pattern;
wherein at least one of said group of first electrode and said group of second electrode is a group of wavy conductive lines, each of said wavy conductive line comprises multiple troughs of waves and multiple crests of waves, and an interval between two adjacent said troughs of wave in each said wavy conductive line is larger than 1.5 times of a predetermined value, and wherein an amplitude difference between adjacent said trough of waves and said crest of waves in each said wavy conductive line is smaller than ⅓ times of said predetermined value, the predetermined value is a pixel pitch of a display, is the distance between the centers of two adjacent pixels in the display.

2. The electrode pattern according to claim 1, wherein at least two of said intervals in each said wavy conductive line are different, or at least of two said amplitude differences in each said wavy conductive line are different.

3. The electrode pattern according to claim 1, wherein the numbers of said troughs of waves and said crests of waves in adjacent said wavy conductive lines are different.

4. The electrode pattern according to claim 1, wherein two adjacent said wavy conductive lines in said group of first electrodes have different wavy shapes, and two adjacent said wavy conductive lines in said group of second electrodes have different wavy shapes.

5. The electrode pattern according to claim 1, when said electrode pattern is disposed on said display, the angle between said electrode pattern and the pixel pattern of said display ranges from 30° to 60°.

6. The electrode pattern according to claim 1, wherein said mesh pattern is a non-periodic pattern with irregular mesh cell.

7. The electrode pattern according to claim 1, wherein the pitch of said wavy conductive lines is at least 20 times greater than the width of said wavy conductive lines.

8. The electrode pattern according to claim 1, wherein the pitch of said wavy conductive lines ranges from 150 microns to 6000 microns.

9. The electrode pattern according to claim 1, wherein the width of said wavy conductive lines ranges from 1 micron to 10 microns.

* * * * *